(12) United States Patent
Karnik et al.

(10) Patent No.: US 7,212,021 B2
(45) Date of Patent: May 1, 2007

(54) MANUFACTURING INTEGRATED CIRCUITS AND TESTING ON-DIE POWER SUPPLIES USING DISTRIBUTED PROGRAMMABLE DIGITAL CURRENT SINKS

(75) Inventors: Tanay Karnik, Portland, OR (US); Peter Hazucha, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 599 days.

(21) Appl. No.: 10/097,136

(22) Filed: Mar. 12, 2002

(65) Prior Publication Data

US 2003/0176982 A1 Sep. 18, 2003

(51) Int. Cl.
*G01R 31/26* (2006.01)
(52) U.S. Cl. .................. 324/765; 324/763; 324/158.1
(58) Field of Classification Search ........ 324/763–765, 324/768–769, 771, 158.1; 331/57, 177 R; 327/156–159, 278, 281
See application file for complete search history.

(56) References Cited

U.S. PATENT DOCUMENTS

| | | | | |
|---|---|---|---|---|
| 4,962,375 A | * | 10/1990 | Hirane et al. ............... 345/82 |
| 5,757,203 A | * | 5/1998 | Brown ........................ 324/765 |
| 5,949,292 A | * | 9/1999 | Fahrenbruch et al. ......... 331/57 |
| 6,469,493 B1 | * | 10/2002 | Muething, Jr. et al. .. 324/158.1 |
| 6,542,040 B1 | * | 4/2003 | Lesea ........................... 331/11 |
| 6,631,338 B2 | * | 10/2003 | To et al. ..................... 702/107 |
| 6,927,590 B2 | | 8/2005 | Iadanza | |

OTHER PUBLICATIONS

U.S. Appl. No. 11/095,950, entitled Programmable Current Load Systems and Methods, by Peter Hazucha, Gerhard Schrom, and Tanay Karnik, filed Mar. 31, 2005.

Dragone, Nicola, et al., "An Adaptive On-Chip Voltage Regulation Technique for Low-Power Applications", Proceedings of the 2000 International Symposium on Low Power Electronics and Design, pp. 20-24 (Aug. 2000).

* cited by examiner

*Primary Examiner*—Minh N. Tang
(74) *Attorney, Agent, or Firm*—Matthew C. Fagan

(57) ABSTRACT

A method for designing and testing on-die power supply, power distribution, and noise suppression techniques for integrated circuits such as microprocessors is described. A network of time varying loads is distributed along the power supply grid to facilitate testing of new power supplies and grids and noise suppression techniques before design of the chip is completed. Several programmable current sinks are described for presenting loads according to a preferred test-waveform current. Transient, including droop detection, and static testing is easily performed using the described methods and circuitry.

29 Claims, 10 Drawing Sheets

MANUFACTURING INTEGRATED CIRCUITS AND TESTING ON-DIE POWER SUPPLIES USING DISTRIBUTED PROGRAMMABLE DIGITAL CURRENT SINKS

TECHNICAL FIELD

This invention relates to integrated circuits and to methods for manufacturing and testing integrated circuits, and more particularly to power distribution on integrated circuits.

BACKGROUND

The trend in the electronics industry is to achieve ever faster switching speeds and increased circuit densities at the component and system levels. Another trend has been to reduce operating voltages and power consumption. These trends are placing more stringent demands on the on-die power distribution systems of integrated circuits, such as microprocessors. For example, higher switching speeds and clock frequencies lead to increased current demands and to higher inductive noise (L di/dt) on the power grid. Power saving modes of operation lead to large and rapid swings in current demand from the power distribution system. The lowering of operating voltages concomitantly narrows the voltage regulation window of the on-die supply voltage level (for example maintaining the supply voltage within 10% peak-to-peak). Increased power noise (from switching currents and power saving modes) and narrowing of the voltage regulation window (from reduced operating voltages) have pushed designers to explore on-die voltage regulation and power distribution techniques to achieve successful chip level and system level designs.

SUMMARY

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

The present invention provides techniques for accurately testing on-die voltage regulation, power distribution, and noise reduction techniques allowing designers to evaluate new design techniques prior to production of the completed integrated circuit. Design techniques for accurate repeatable modeling of the di/dt power noise are provided to perform on-die testing of proposed designs. Time varying loads may be provided to mimic the expected changing current demands and may be distributed along the on-die power distribution grid. The loads may be used to design and evaluate power distribution systems, to accurately model load requirements, and predictably test power noise suppression techniques before time consuming and costly incorporation into an integrated circuit. Programmable current sinks may be used on the die for controlled repeatable testing. Illustrative examples using a microprocessor are discussed below with reference to FIG. 1.

Figure 1:
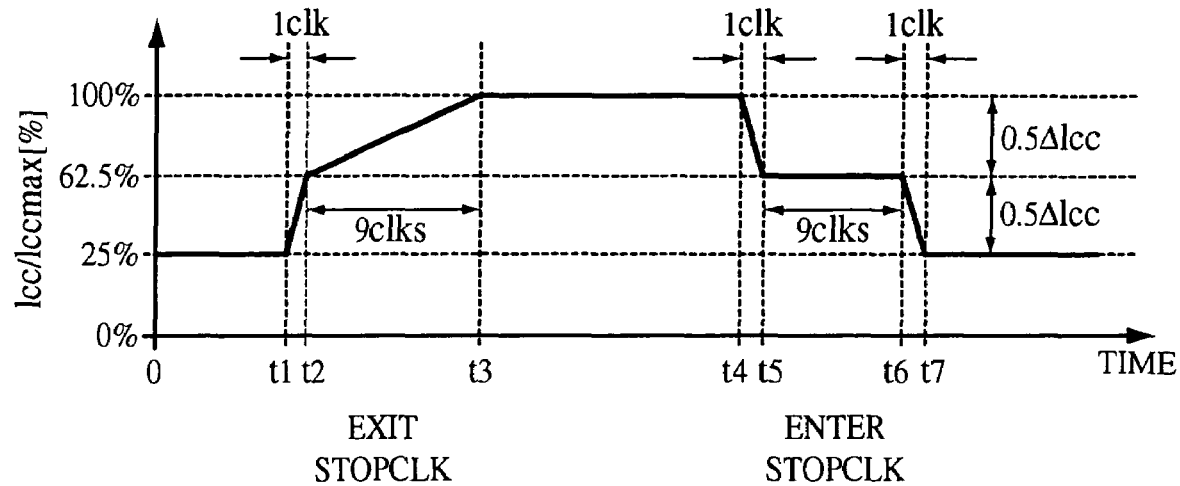
FIG. 1 shows transient current demands of a microprocessor.

The power supply current drawn by a microprocessor often changes dramatically depending upon its state. Many modern microprocessors have at least one power-saving state in which portions of the architecture are deactivated thereby conserving power. The stop-clock state is one example of a power saving state. FIG. 1 shows the supply current, Icc, (as a fraction of the maximum supply current, Icc max) drawn by a microprocessor in the stop-clock and active states. From time t0 to time t1, the microprocessor is in the stop-clock power saving mode. At time t1, the microprocessor begins the transition from the stop-clock state into the active state. As various portions of the microprocessor circuitry are activated, the supply current, Icc, increases until reaching the full on state at time t3. At time t4, the microprocessor begins the transition back into the power saving stop-clock state. As portions of the microprocessor circuitry are deactivated during this transition, the supply current, Icc, decreases until reaching the stop-clock state at time t7. The supply current may drop to about 25 percent of maximum as shown in FIG. 1 due to leakage current and because not all sections of the microprocessor may be deactivated in the stop clock state. Some portions of the microprocessor may take longer than others to make the transition to the active state or to the stop-clock state, which is accounted for in the stepped slope of the current waveform in FIG. 1. FIG. 1 is an example of the severe on-die transient power demands in a microprocessor.

Figure 15:
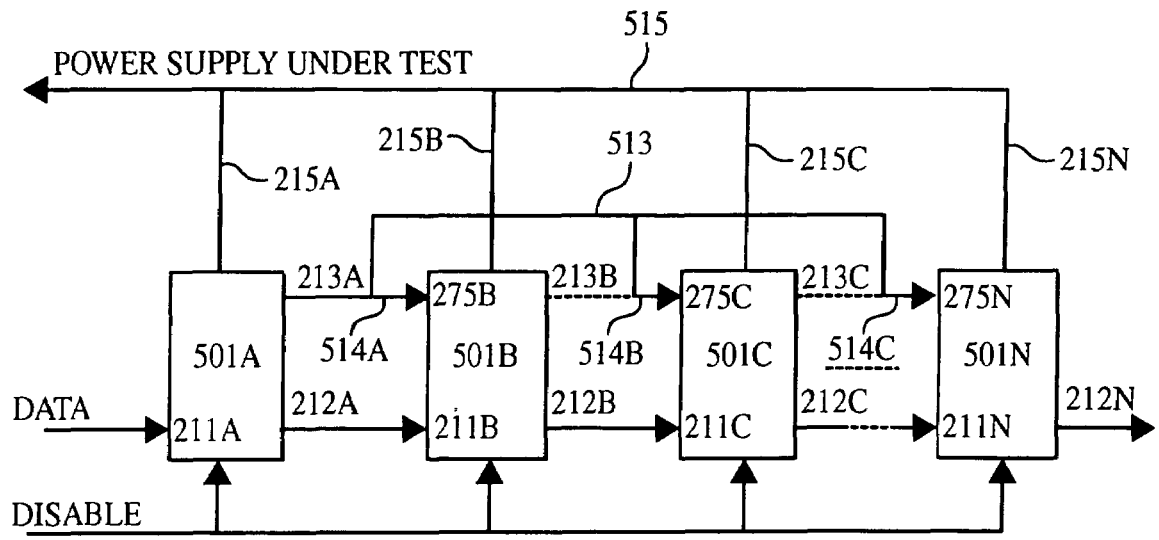
FIG. 15 is a schematic block diagram of a distributed current sink network for distributed testing of a power supply or power distribution grid.

For the microprocessor example, time varying loads may be used to mimic the transient power demands (such as those illustrated in FIG. 1) to test proposed power distribution grids for example, Vcc grids, ground grids, noise suppression techniques, and voltage regulation circuitry and techniques. Referring to FIG. 15, a network of time-varying loads 501A–501N may be distributed along a power supply grid 515 for testing. The number of time varying loads, N, may be small or large depending upon the application. More accurate modeling and testing of the on-die power-distribution grid may be achieved by distributing the time-varying loads 501 along the grid 515 according to planned or extant circuit requirements. The aggregation of the distributed loads may be chosen to model the aggregate current demands of the circuit. For a microprocessor example, the current characteristics illustrated in FIG. 2 may be chosen as a test-current waveform for the time varying loads 501 in FIG. 15. Although the current characteristics of FIG. 2 will be discussed as an example of a test-current waveform, other current characteristics, such as exponential waveforms, may be used.

Figure 2:
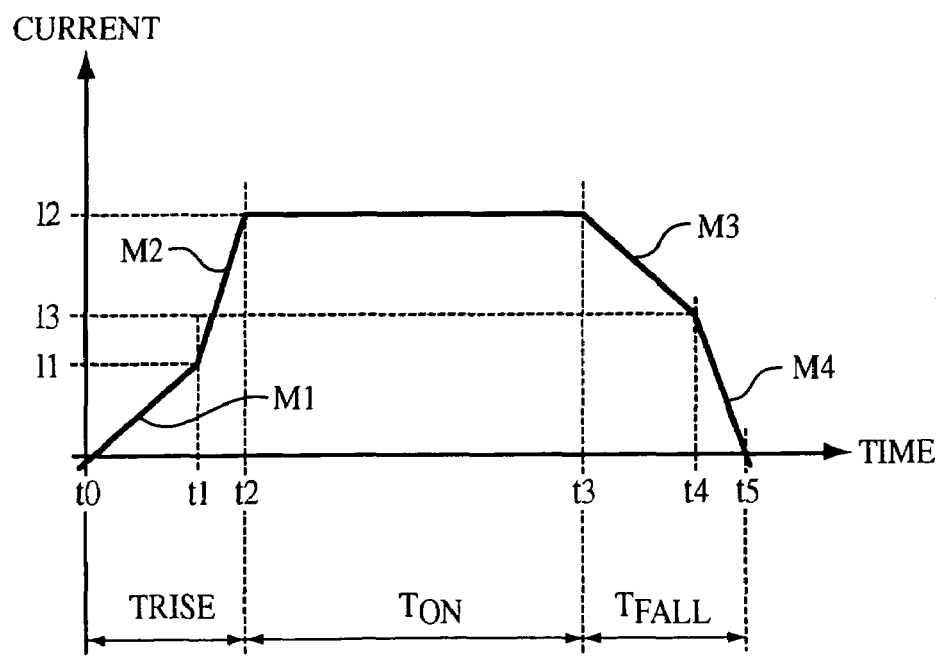
FIG. 2 shows a test-current waveform.

As illustrated in FIG. 2, the test-current waveform includes a dual sloped leading edge, an on period, and a dual sloped trailing edge. The current rises with a slope of M1 from zero at time t0 to I1 at time t1 and then rises with a slope of M2 from time t1 to t2 reaching a final value of I2. The rise time of the waveform, Trise, may be defined as the period from time t0 and to t2 in FIG. 2. Similarly, the current declines from I2 to I3 with a slope of M3 from time t3 to t4 and then continues to decline from I3 to zero with a slope of M4 from time t4 to t5. The on period extends from time t2 to t3. Two types, "staggered" and "pulsed," of programmable current sinks will be described which may be used for the time varying loads 501 in FIG. 15. Each current sink 501 may be programmed to mimic the test-current waveform of FIG. 2 or other waveforms as desired.

Figure 5:
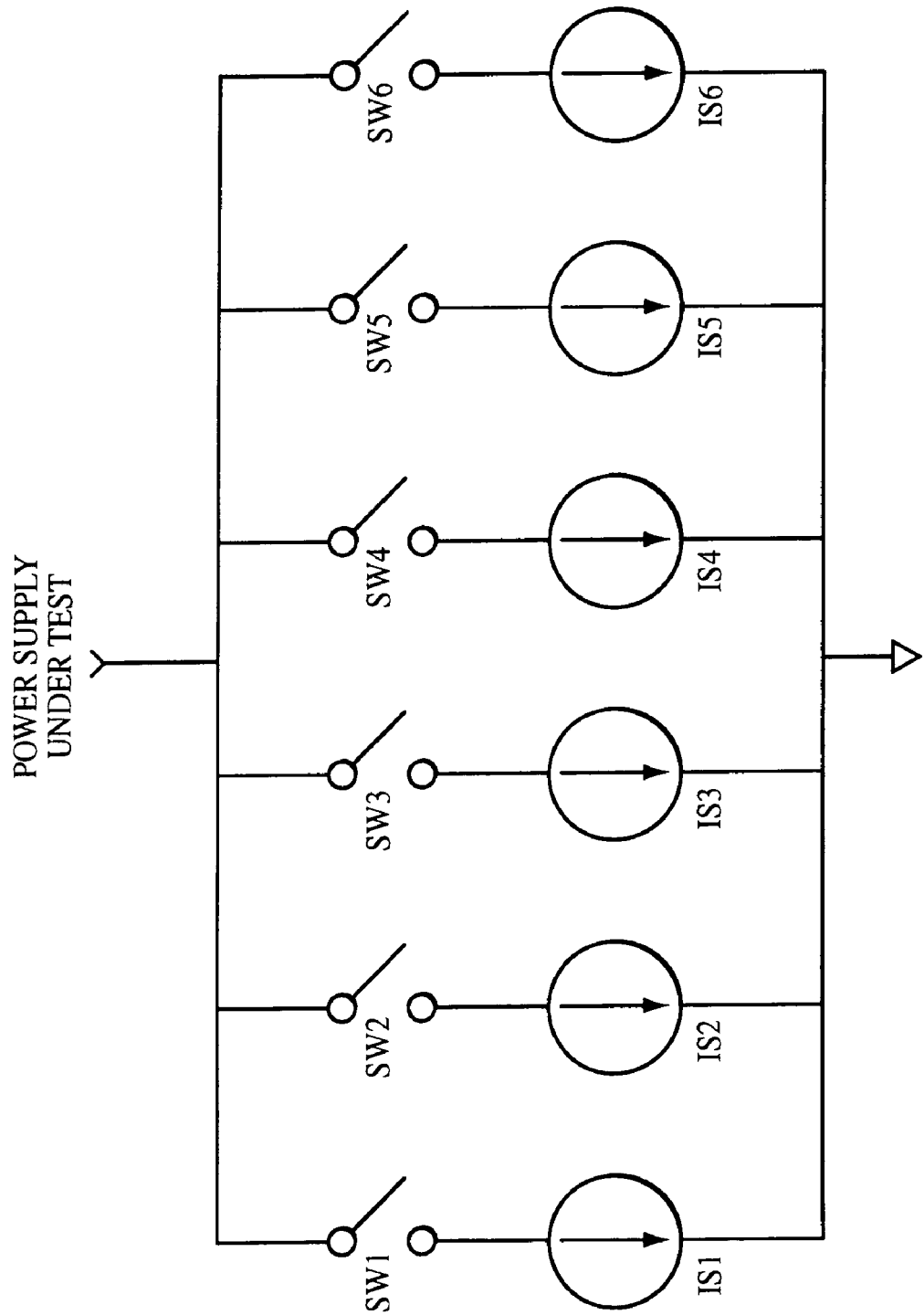
FIG. 5 is a schematic block diagram of a time-varying load.

The "staggered" approach may generate the test-current waveform by summing two or more time-staggered currents. Referring to FIG. 5, six current sources, Is1–Is6, each having its own current value may be connected through switches, SW1–SW6, to create a time-varying load for connection to a power supply under test. Assume that each current source may be programmed to sink a specific value of current and that each switch may be programmed connect and disconnect the current sink at specific times. The load presented to the power supply under test will vary depending upon the number of the current sinks connected and their respective values.

Figure 3:
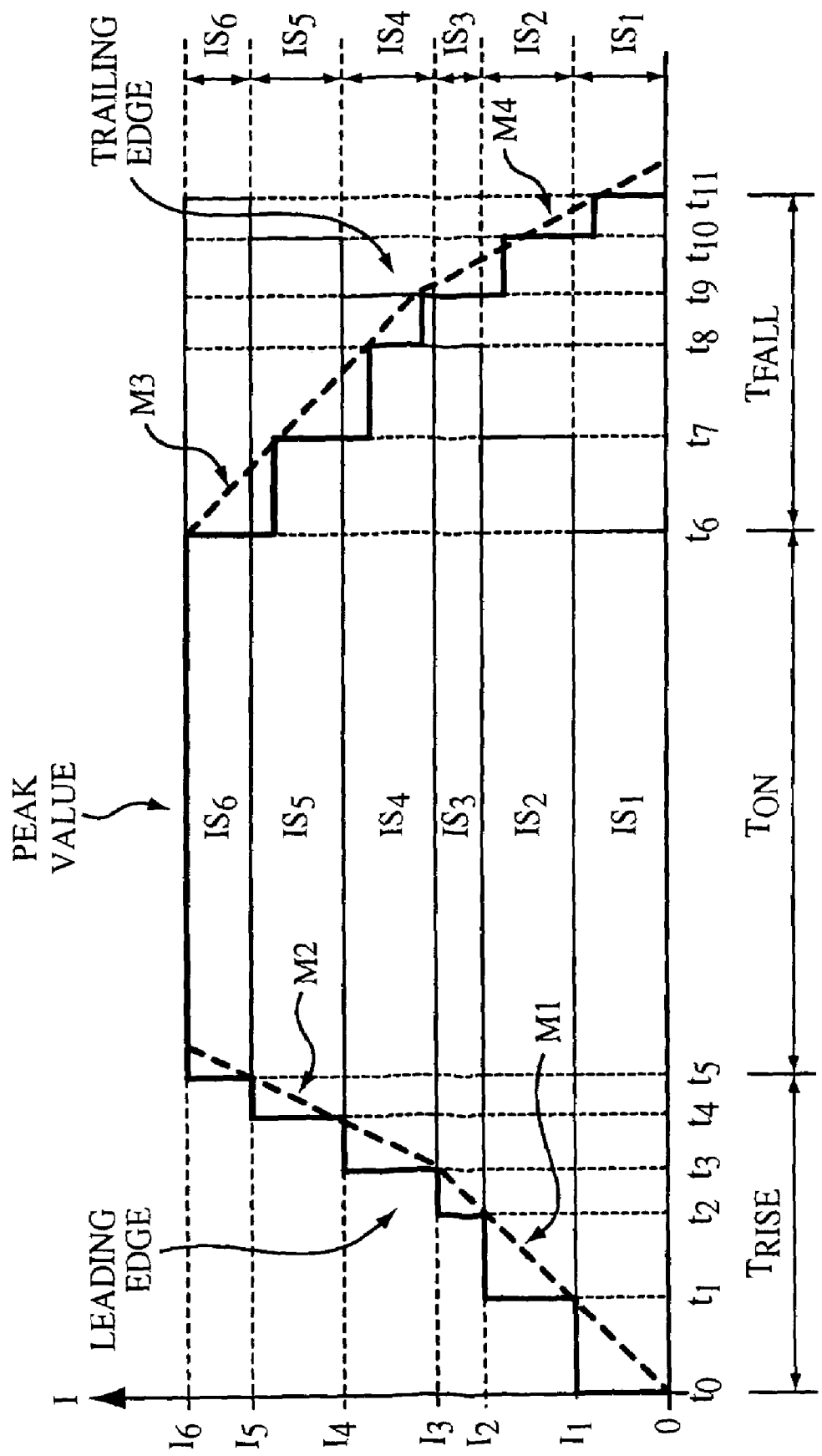
FIG. 3 shows a test-current waveform produced by time staggering current sinks.

Referring to FIG. 3, six time-staggered vertically stacked rectangular areas representing the current presented by each current sink element, Is1–Is6, to the power supply under test are shown. The load current for the circuit of FIG. 5 (which is the sum of the currents presented by each sink element) is shown in bold with the leading edge, peak, and trailing edge labeled in FIG. 3. Assume that switches SW1–SW6 are open and the load current is zero just prior to time t0. At time t0, switch SW1 may be closed raising the load current by Is1. At time t1, switch SW2 may be closed raising the load current by Is2. Switches SW3, SW4, SW5, and SW6 may be closed in succession respectively at times t2, t3, t4, and t5 to incrementally raise the load current as shown by the leading edge of the load current in FIG. 3. After time t5, all switches SW1–SW6 may be closed to produce the peak load current. At time t6, switch SW1 may be opened disconnecting sink element Is1 and reducing the load current by Is1. At time t7, switch SW2 may be opened disconnecting sink element Is2 and reducing the load current by Is2. Switches SW3, SW4, SW5, and SW6 may be opened in succession respectively at times t8, t9, t10, and t11 to incrementally lower the load current as shown by the trailing edge of the load current in FIG. 3. The magnitudes and the timing of the currents may be scaled to provide the desired rise and fall transition characteristics. For example, in FIG. 3 currents, Is1–Is3 and Is4–Is6 may be scaled in magnitude and timing to produce the slopes M1 and M2. For reasons of economy (as will be apparent from the discussion that follows) each switch SW1–SW6 may be held closed for the same fixed period of time (i.e., periods t0–t6, t1–t7, t2–t8, t3–t9, t4–t10, and t5–t11 in FIG. 3 may be equal). Therefore, the trailing edge may be an inversion of the leading edge (i.e., slope M1=–M3 and slope M2=–M4).

As can be seen from FIG. 3, the load current produced by the staggered sink elements may closely approximate the test current waveform of FIG. 2 shown as a dashed line in FIG. 3. As discussed below, the sink elements may be turned on and off gradually to produce a smooth ramp more closely approximating the dashed line. Although six current sink elements are shown in FIGS. 3 and 5, any number may be used for the programmable current sink to increase (or decrease) the resolution of the test-current waveform. The duration of the peak, Ton, may be increased or decreased by varying the total on time of the switches. Although variations in turn on times (e.g., to–t1≠t4–t5) are shown in FIG. 3, using a constant delay between each turn on time can help reduce circuit requirements. Conversely providing a programmable on time for each switch can increase the versatility of the current sink (to produce more complex test-current waveforms such as asymmetrical leading and trailing edges) at the expense of circuit size and complexity.

Figure 4:
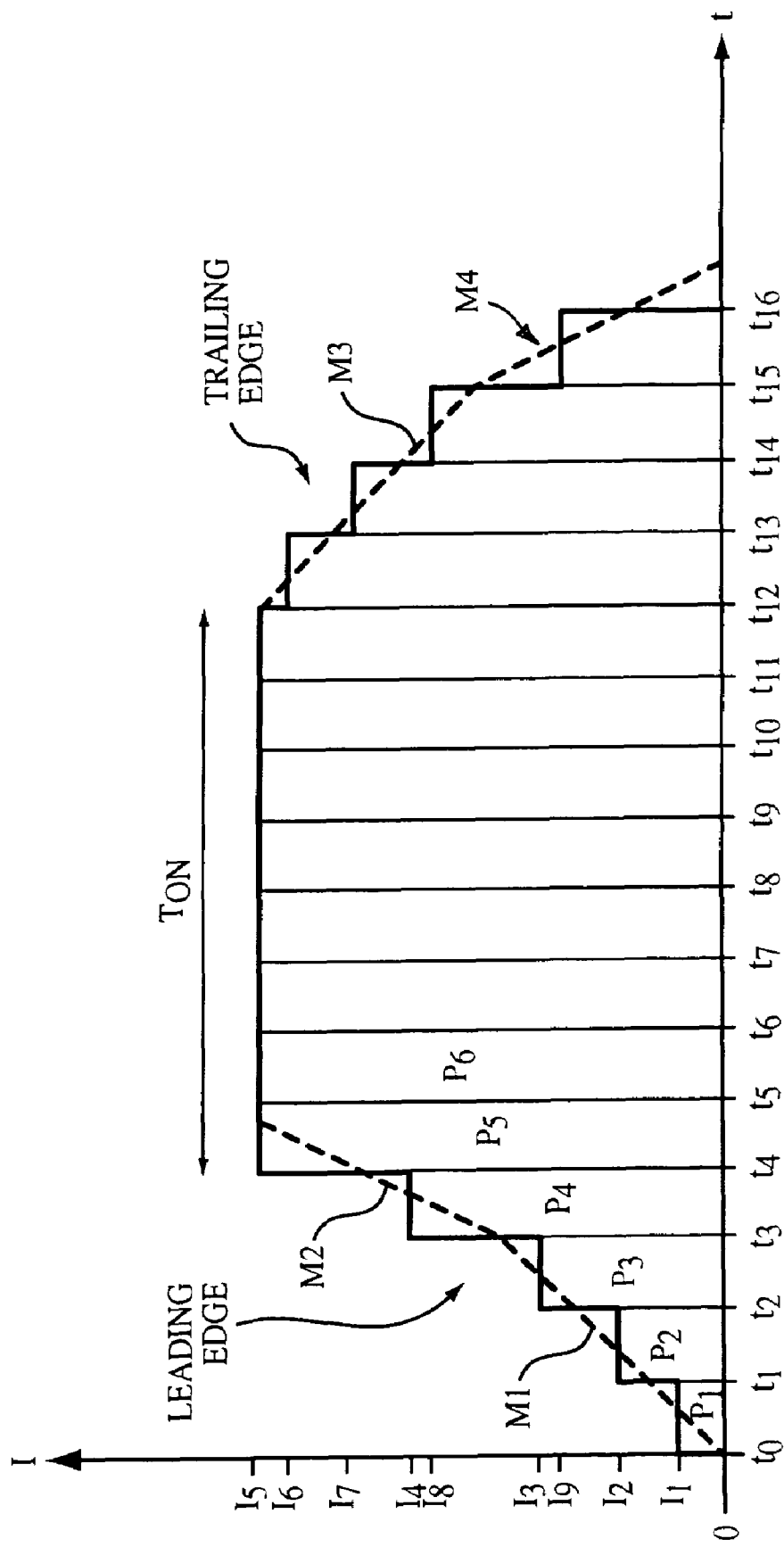
FIG. 4 shows a test-current waveform produced by pulsed current sinks.

The "pulsed" approach may generate the test-current waveform using a series of current pulses without overlapping. The pulsed approach may be used to produce test-current waveforms having asymmetric leading and trailing edges. All pulses may have the same duration and be programmed in amplitude to provide any desired test current waveform as shown by the example in FIG. 4. A variation discussed below in connection with FIG. 11 may provide a variable duration pulse for Ton. Referring again to FIG. 5, assume that current sources Is1–Is6 sink currents I1–I6, that each switch SW1–SW6 is programmed to remain on for a fixed time, and that the switches are turned on and then off in order: switch SW1 turns on at time t0 and off at time t1, switch SW2 turns on at time t1 and off at time t2, switch SW3 turns on at time t2 and off at time t3, switch SW4 turns on at time t3 and off at time t4, switch SW5 turns on at time t4 and off at time t5, and switch SW6 turns on at time t5 and off at time t6. Assume also that there is no dead zone between, and there is no overlap of, the current pulses. Referring to FIG. 4, operating the switches and current sinks of FIG. 5 as described results in the first six pulses in the series labeled P1–P6 having current values of I1–I6 and producing the portion of the test-current waveform from to–t6. It should be apparent that the leading edge, peak, and falling edge characteristics of the test-current waveform may be determined by the amplitude and timing of current pulses. Similarly, the resolution of the test-current waveform may be determined by the number of current sinks and the sampling rate, i.e., the speed of operating the switches in the example of FIG. 5.

Figure 6:
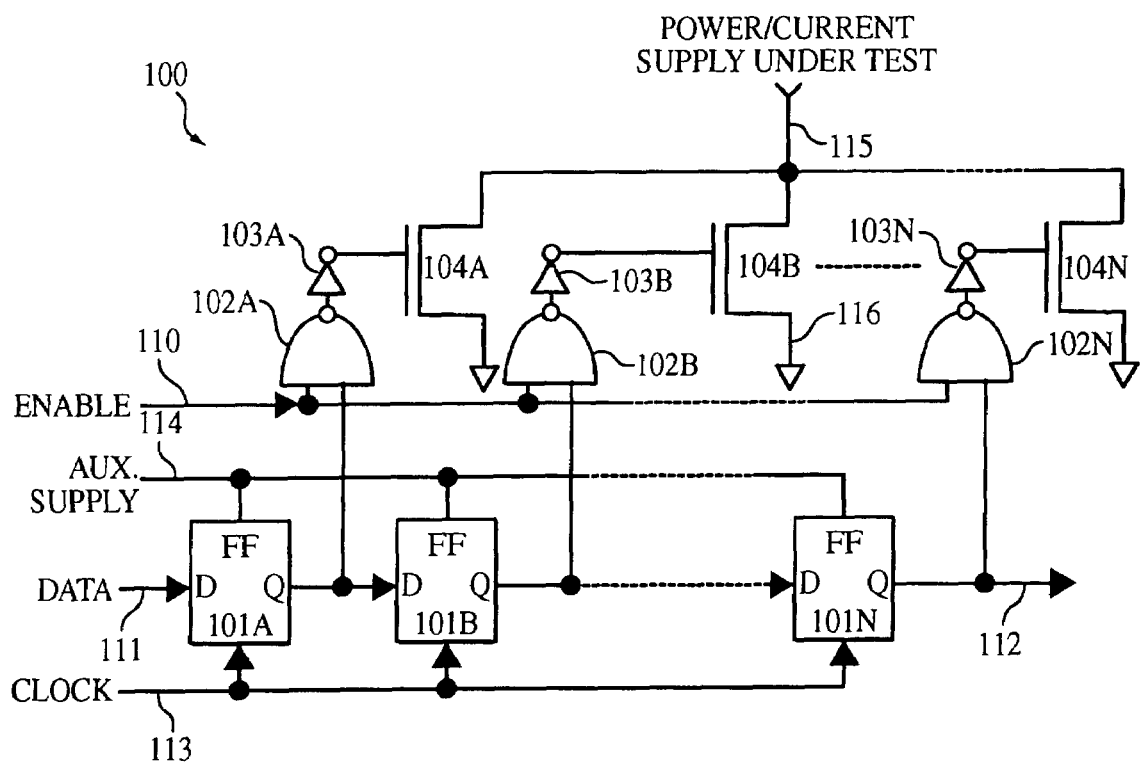
FIG. 6 is a schematic block diagram of a programmable N-bit current sink element.

A schematic diagram of a scaleable N-bit current sink element 100 for use in a programmable current sink is shown in FIG. 6. The number of bits, N, is unrelated to the number of time varying loads, N, discussed above in connection with FIG. 15. The current sink element 100 includes nMOS transistors 104A, 104B, ... 104N scaled geometrically in powers of 2 to sink a current I, 2I, ... $2^{(N-1)}$I, respectively (e.g., 10, 20, and 40 micro amps for a 3 bit element). The sink element 100 may be programmed to sink any integer multiple of current I up to the maximum of $(2^N-1)I$. The drain of each transistor may be connected to the output 115 at which point the transistor sink currents are summed. The gate of each transistor, 104A–104N, may be driven by a respective NAND gate, 102A–102N, followed by an inverter driver, 103A–103N. The NAND gates, 102A–102N, each may have one input driven by a common enable control line 110 and a second input driven by the output, Q, of a respective flip flop, 101A–101N. The enable line 110 may be used to turn the transistors off regardless of the state of the flip-flops to disable the output 115. Flip flops 101A–101N may be connected serially forming a shift register having a data input line 111, a data output line 112, and a clock input line 113. The flip-flops 101, NAND gates 102, and inverters 103, may be powered by an auxiliary power supply 114 to avoid introducing any unwanted noise or fluctuations in the test-current. All or some of the support circuitry may be powered by the auxiliary power supply 114.

In operation, the sink current for the sink element may be programmed by serially shifting a scan data chain into the flip-flops using the clock 113 and the data 111 inputs. A "1" may be loaded into a flip-flop to turn on its respective transistor. Assume, for example, that the sink element of FIG. 6 has only 3 bits, that transistors 104A–104N have been respectively sized to sink 10, 20 and 40 micro amps when turned on, and that a 50 micro amp current is required. The current sink element 100 may be programmed to sink 50 micro amps by setting flip flops 101A and 101N and clearing flip flop 101B thereby turning on transistors 104A and 104N when the enable signal is provided. Although three-bits are shown, the sink element may have as many (or few) bits (transistors with respective flip flops, NAND gates, and drivers) as required to satisfy the current resolution and range requirements of the programmable current sink. A four-bit current sink element 100 (with four transistors, flip flops, NAND gates, and drivers) may provide a good range of sink current without undue circuit complexity. The inverter drivers 103 may be scaled according to the characteristics of their respective transistors 104 to provide an on-off/off-on transition time suitable to the application.

Figure 7:
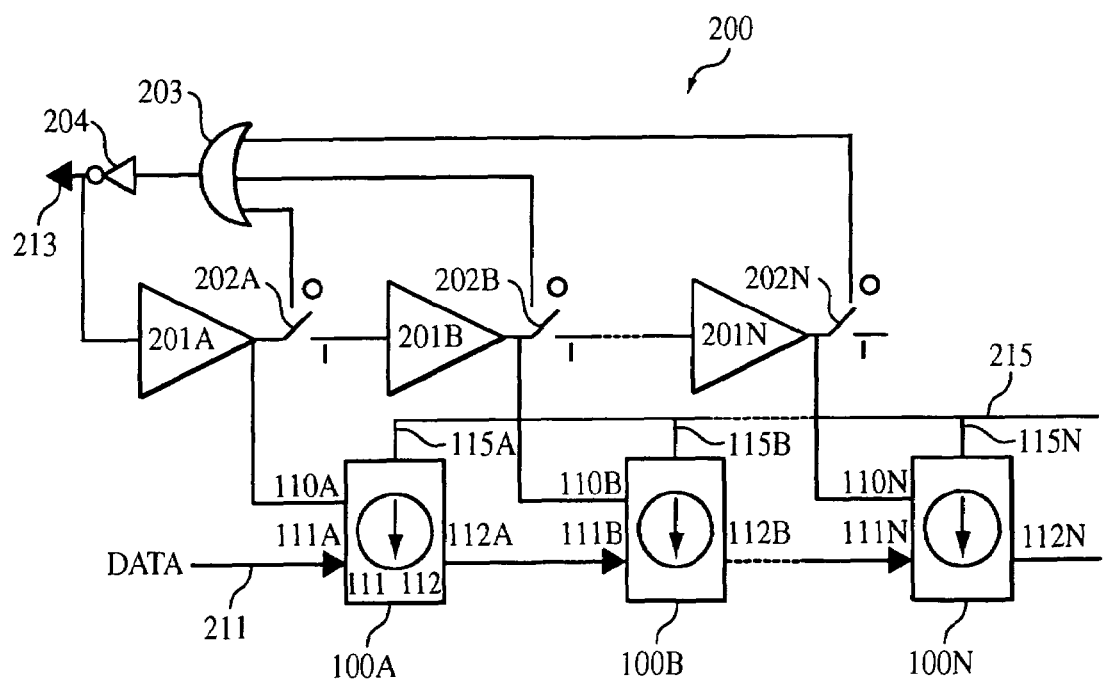
FIG. 7 is a schematic block diagram of a programmable N-stage staggered current sink.

A first embodiment of a programmable N-stage staggered current sink 200 is schematically shown in FIG. 7. The number of stages, N, of the current sink 200 is unrelated to the number of bits, N, in each sink element and the number of time varying loads, N. Each stage (A, B, . . . N) may comprise a current sink element 100, a delay element 201, and a switch 202. The outputs 115A, 115B, 115N of the sink elements 100 may be connected to the current sink output 215 (actually the element outputs 115 and the sink output 215 sink current and may be connected directly to the power supply grid being tested) where they may be summed to create a test-current waveform having the desired leading edge, peak, and trailing edge characteristics as described above in connection with FIG. 3. All or some of the support circuitry may be powered by an auxiliary power supply separate from the supply under test. Although three stages are shown in FIG. 7 and the programmable current sink 200 may be scaled to include any desired number of stages, N, nine stages may be sufficient.

Each current sink element, 100, may be of the type shown in FIG. 6 having a data input 111, a data output, 112, and a clock input (113 in FIG. 6) for receiving a scan data chain for setting its sink current level. As shown in FIG. 7, the data inputs 111 and outputs 112 of the sink elements 100 may be daisy-chained to form a shift register allowing all of the elements 100 in the programmable sink 200 to be programmed via a single data line 211 using concatenated scan data chains. Similarly, all (or groups) of the programmable current sinks 200 throughout the test chip may have the data inputs and outputs daisy chained to allow programming of all (or groups) of the current sinks 200 via one (or more) serial scan data lines.

The delay elements 201 (each of which may comprise two 20 pico-second-propagation-delay inverters to create a 40 pico-second delay) are connected to form a delay line. The delay select switches 202, which may be 1-to-2 demultiplexers, may route the output of each delay element to the next delay element or to OR gate 203. The delay select switches 202 may be controlled by respective flip flops (not shown) which may be programmed by another (or the same) scan data chain similar to the arrangement for programming the current level of the current sink elements 100. Only one of switches 202A to 202N should be switched to position "0" during operation. When the switch is in the "0" position, the input of the subsequent delay element may be grounded to ensure that the subsequent delay and current sink elements remain off. The output of OR gate 203 may be fed back through inverter 204 to the input of the first delay element 201A in, and the input of, the delay line, providing feedback for oscillation of the delay line. The state of the delay select switches may therefore determine how many of the N stages of the sink will be utilized and the period of the oscillator. The enable input, 110A, 110B, . . . 110N, of each sink element 100A, 100B, . . . 100N, may be connected to the output of its respective delay element, 201A, 201B, . . . 201N. As a pulse propagates through the delay line, the sink elements 100 may be turned on in succession and then off in succession.

For example, assume an initial state, T0, in which the outputs and inputs of all delay elements are low and assume that delay select switches, 202A, 202B and 202N, are set to the 1, 1, and 0 positions, respectively. All of the sink elements 100 will be off since the enable lines 110A–N will also be low and the output of the OR gate 203 presented to the input of the inverter 204 will be low. After a small delay determined by the inverter propagation time, the inverter, output will go high. After a first delay (determined by the first delay element 201A), the output of the first delay element 201A will go high turning on sink element 100A. After a second delay (determined by the second delay element 201B), the output of the second delay element 201B will go high turning on sink element 100B. The succession will continue until the output of delay element 201 N goes high turning on current element 100N and presenting a high input to OR gate 203. The output of inverter 204 will then go low after the propagation delay of OR gate 203 and inverter 204 and a low state will propagate through the delay elements 201 turning the current elements 100 off in succession. When the last delay element 201N goes low the entire cycle will repeat.

It should be clear from the description of current sink 200 that (1) the rise time, $T_{rise}$, and fall time, $T_{fall}$, of the test waveform will be equal, (2) the rise and fall times, $T_{rise}$, and $T_{fall}$, may be controlled using the delay select switches 202 (3) the on time and off time of the test waveform will be equal and may be determined by the propagation delay of the OR gate 203 and inverter 204, (4) the oscillator period is equal to the sum of the rise time and the fall plus time twice the on time of the test current waveform ($T_{osc}=2T_{on}+T_{rise}+T_{fall}$), (5) the leading and trailing edge characteristics may be determined by the sink elements 100 as discussed above in connection with FIG. 3, and (6) the oscillator may run continuously provided that at least one of the delay select switches is set to provide feedback. The oscillator waveform on the output of the inverter 204 may be used as a reference signal for making test measurements or for synchronizing other current sinks. Current sink 200 may therefore supply a controllable periodic load current with a synchronization signal for transient testing, such as droop detection.

Variations of the current sink 200 may include one or more of the following features. The delay select switches 202 may be moved to the inputs of OR gate 203 leaving direct connections between delay elements 201. An input for selecting an external clock signal may be provided to synchronize the current sink 200 with test equipment or other current sinks. The sink elements 100 may have their inverter drivers (103 FIG. 6) scaled to provide on-off/off-on transitions having the same duration as the propagation delay of delay elements 201 making the test current waveform into a smooth ramp as compared to discontinuous steps.

In operation, the scan data chain for setting the current level of each sink element 100 and the scan data chain for setting the state of the delay select switches 202 may be loaded first and then the power supply response may be observed.

Figure 8:
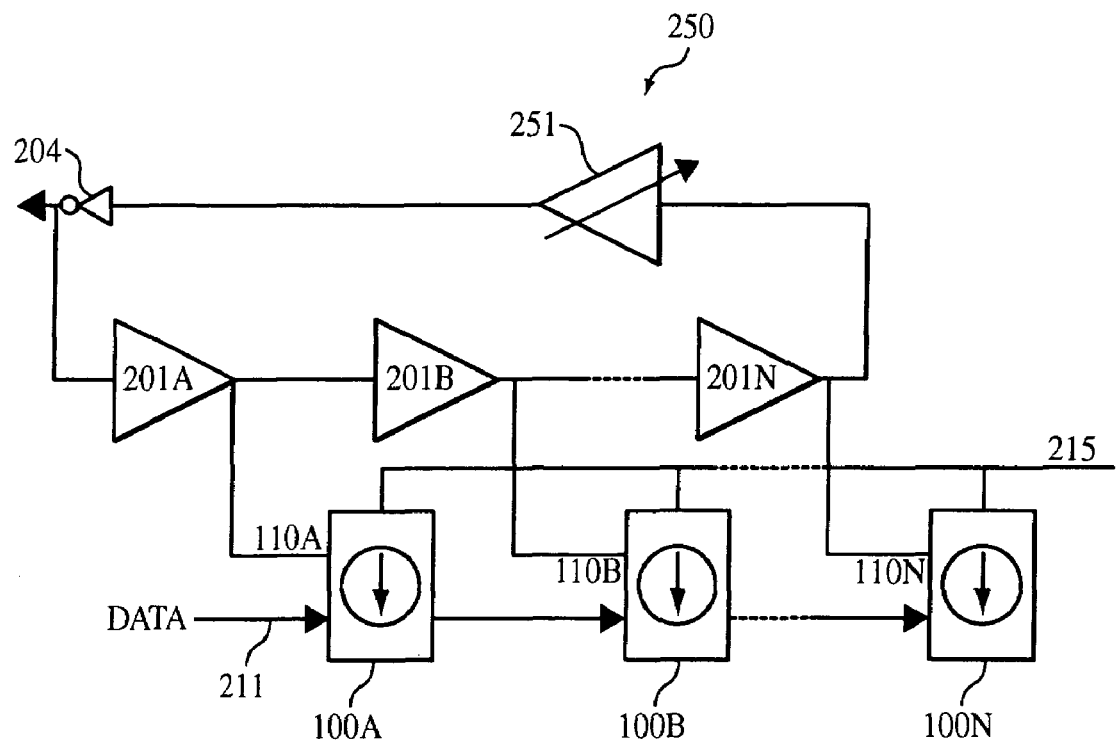
FIG. 8 is a schematic block diagram of a programmable N-stage staggered current sink with a variable delay between on and off transitions.

Referring to FIG. 8, a programmable N-stage staggered current sink 250 with variable on and off time is shown. The sink 250 is similar to sink 200 of FIG. 7, however that the delay select switches 202 and the OR gate 203 have been removed and a variable delay 251 has been added. The removal of the delay select switches 202 and OR gate 203 may restrict the ability to program the rise and fall times of the test-current waveform. However, the addition of the variable delay 251 allows for programming the on and off times. The on and off times of the test-current waveform produced by the current sink 250 will be equal to the sum of the delays from variable delay 251 and inverter 204. All of the stages of sink 250 may be enabled in succession, however, one or more sink elements 100 may be programmed for zero current potentially extending the on and off times. The variable delay 251 may be implemented using a programmable delay line and may be controlled by a set of respective flip flops (not shown) which may be programmed by another (or the same) scan data chain similar to the arrangement for programming the current level of the current sink element 100 described in connection with FIG. 6. In operation, the scan data chain for setting the current level of each sink element 100 and the scan data chain for setting the variable delay may be loaded first and then the power supply response may be observed.

Figure 10:
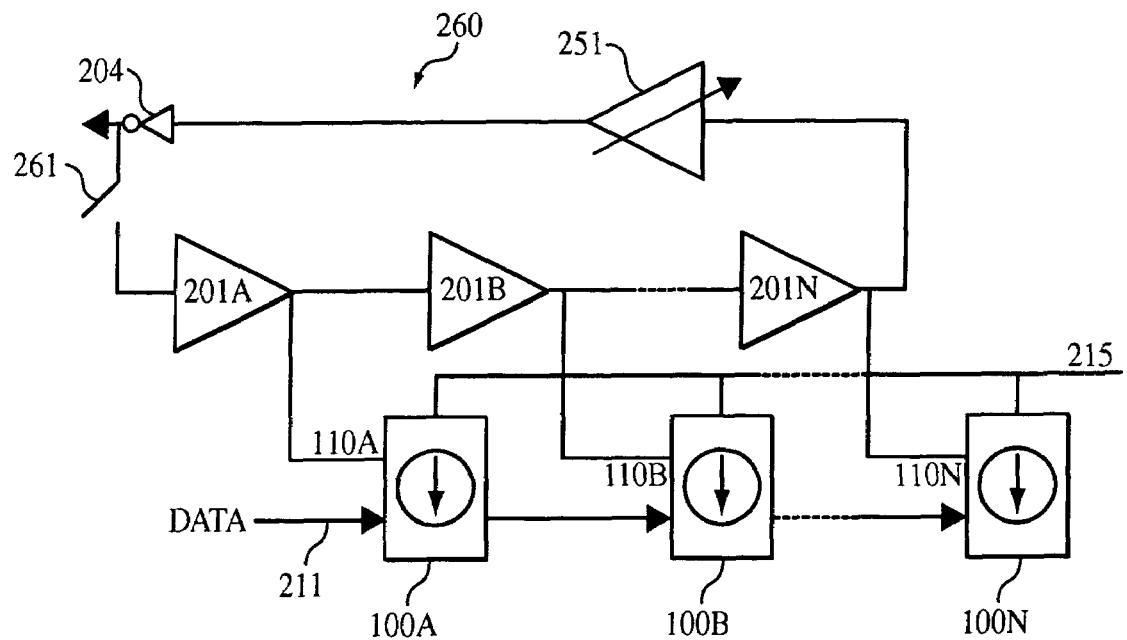
FIG. 10 is a schematic block diagram of a programmable N-stage staggered current sink with a variable delay between on and off transitions and a disable switch.

Referring to FIG. 10, a programmable N-stage time-staggered current sink 260 with a disable switch is shown. The sink 260 is similar to the sink 250 in FIG. 8, however, switch 261 has been added between the inverter 204 and the delay element 201A. The disable switch 261, when open, disables the oscillator, causes all delay elements to return low, and disables all current elements 100. The disable switch 261 may be used to avoid overloads or unnecessary power dissipation, for example during the scan data loading operation.

Figure 12:
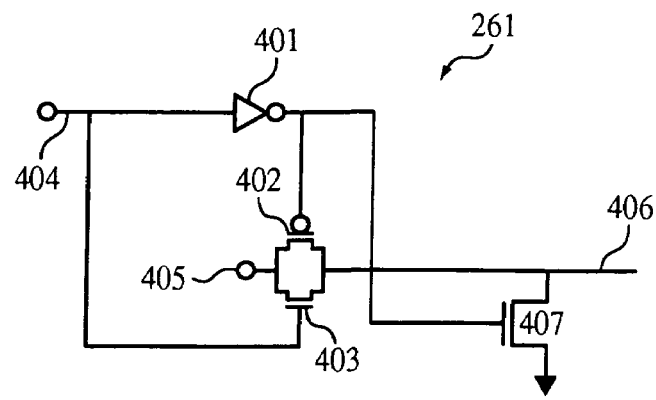
FIG. 12 is a schematic block diagram of a disable switch.

One implementation of switch 261 is shown in FIG. 12. The switch 261 has a control line 404, a data input 405, and a data output 406. Two complementary, pMOS and nMOS, transistors, 402 and 403, are connected in parallel to form the data path between input 405 and output 406. A transistor 407 may be connected between the output 406 and ground to force the output 406 low when the switch 261 is disabled. Inverter 401 provides a complement of the control signal for driving the gates of transistors 402 and 407. When the control input 404 is high, transistors 402 and 403 are on and transistor 407 is off allowing data to pass from the input to the output. When the control input is low, transistors 402 and 403 are off blocking transmission of data from the input to the output, and transistor 407 is on pulling the output low. Switch 261 and a complement of switch 261 may be combined to form a 1-to-2 demultiplexer implementing the delay select switches 202 of FIG. 7. A flip-flop (not shown) may provide memory for the control input 404 and may be programmed using a scanned data chain as described above.

Figure 13:
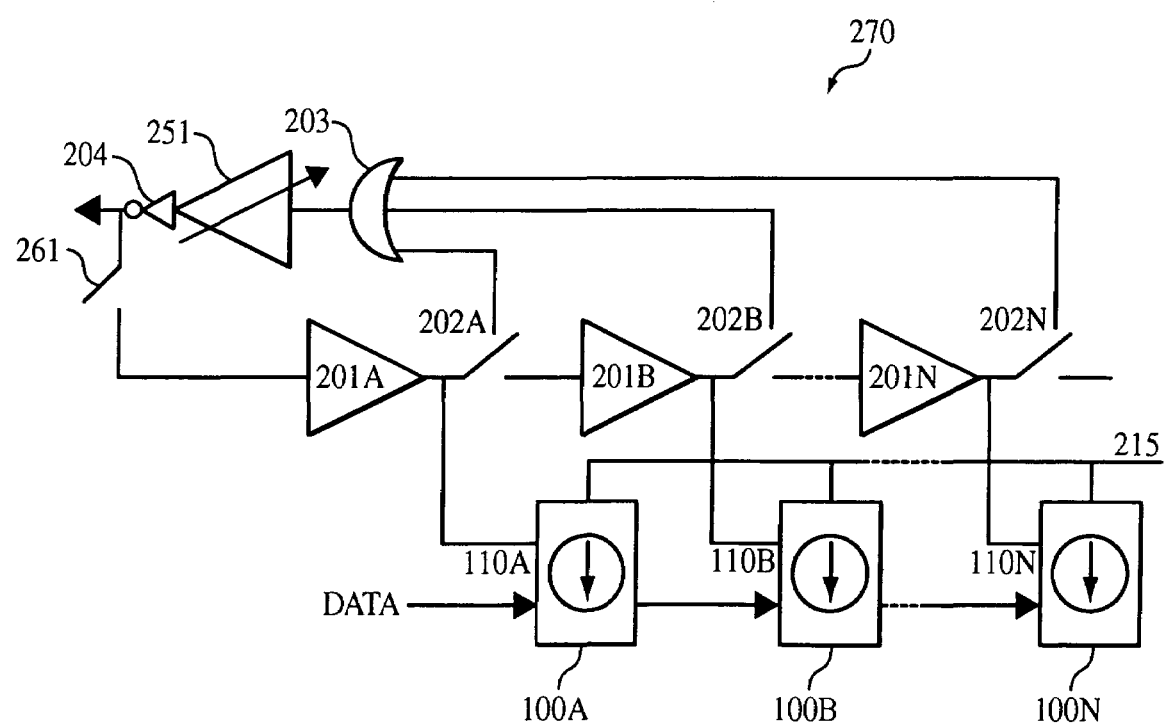
FIG. 13 is a schematic block diagram of a programmable N-stage staggered current sink with variable delay between on and off transitions, a programmable period, and a disable switch.

Referring to FIG. 13, another N-stage programmable time-staggered current sink 270 is shown. Current sink 270 is similar to current sink 200 shown in FIG. 7, however, a programmable delay 251 (FIG. 8) and a disable switch 261 (FIG. 10) have been added. Current sink 270 provides greater flexibility in creating test current waveforms. For example, the rise and fall times may be programmed using the delay select switches 202, the leading and trailing edges may be programmed using the sink elements 100, the on and off times may be programmed using the variable delay 251, and the sink may be disabled using switch 261.

Figure 14:
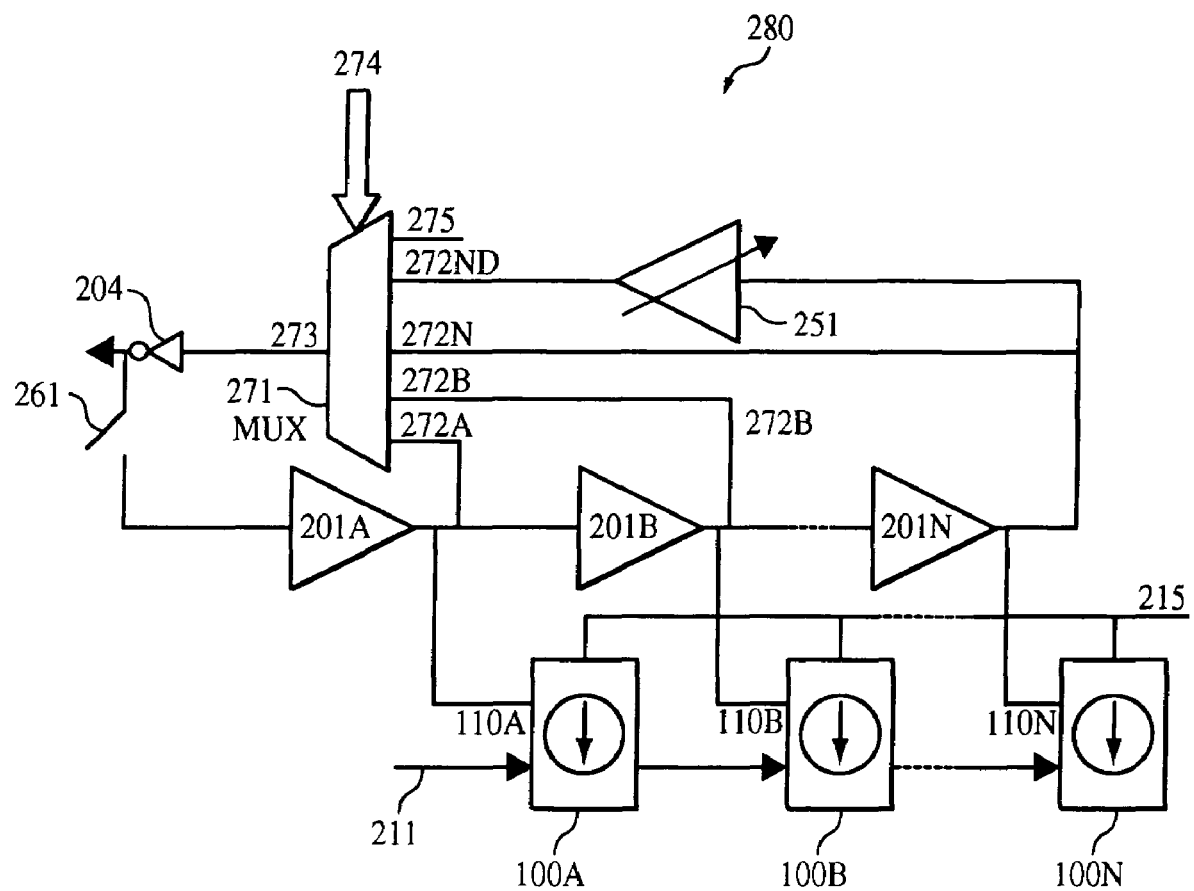
FIG. 14 is a schematic block diagram of a programmable N-stage staggered current sink with an external clock input.

Referring to FIG. 14, another N-stage programmable time-staggered current sink 280 is shown. The current sink of FIG. 14 is similar to the current sink 270 of FIG. 13, however, the delay select switches 202 and OR gate 203 have been replaced with a multiplexer 271 and the variable delay 251 has been moved. The multiplexer 271 may include inputs 272A–272N for connection to a respective delay element 201A–201N, input 272ND connected to the output of the variable delay 251, input 275 for connection to an external clock, selector control lines 274, and an output 273. The multiplexer selection lines 274 may be used to program the rise and fall time of the test-current waveform by selecting inputs 272A–N in the same way that the rise and fall times were set using the delay select switches 202 in current sink 200 discussed above in connection with FIG. 7. The multiplexer 271 may be programmed to select input 272ND to enable the on and off time set by the variable delay 251. Finally, an external clock (e.g., from test equipment or from another current sink 200) may be provided on input 275 and selected using the selection lines 274. Alternatively, the sink 280 may be modified to provide a variable delay element between the multiplexer 271 and the inverter 204 to provide on and off time programmability in combination with rise and fall time combination if desired. The multiplexer 271 may be implemented using switches 261 (FIG. 12) omitting the output-clamping transistor 407 and may be controlled by respective flip flops (not shown) which may be programmed by another scan data chain similar to the arrangement for programming the current level of the current sink element 100 described in connection with FIG. 6. In operation, the scan data chain for setting the current level of each sink element 100, the scan data chain for setting the variable delay, and the scan data chain for setting the multiplexer selection may be loaded first and then the power supply response may be observed.

Figure 9:
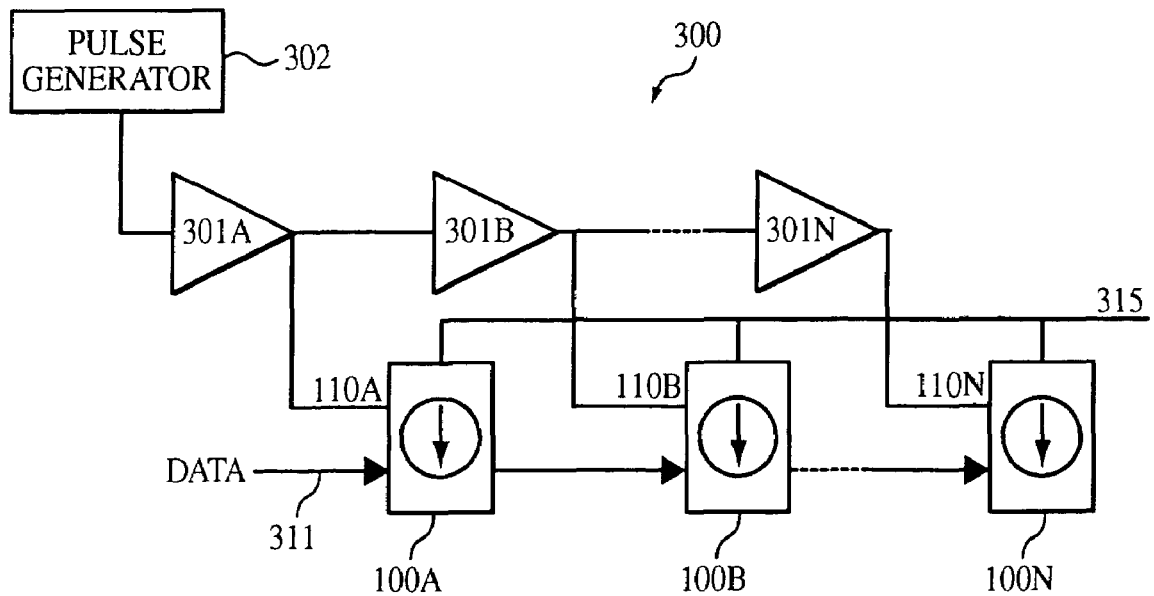
FIG. 9 is a schematic block diagram of a programmable N-stage pulsed current sink.

Referring to FIG. 9, a programmable N-stage pulsed current sink 300 is shown schematically. The sink elements 100 may be implemented as discussed above in connection with FIG. 6. A pulse generator 302 produces pulses having a duration set to determine the desired current pulse duration (e.g., the period t0–t1 in FIG. 4) and a period set to determine the frequency (repetition rate) of the test-current waveform. The pulse generator may feed a delay line having a series of delay elements 301A–301N. All of the delay elements 301 may have a delay period set equal to the pulse width. The delay period and pulse width may need to be lengthened in the programmable pulsed current sinks 300 and 350 by comparison with the programmable staggered current sinks 200, 250, 260, 270, and 280 to maintain a smooth test current waveform. The output of each delay element 301 may be fed to the enable input 110 of a respective sink element 100. The sink elements 100 may be cascaded as described above to allow for serial loading of the scan data. Also, all or some of the support circuitry may be powered by an auxiliary power supply separate from the power supply or power grid under test.

Figure 16:
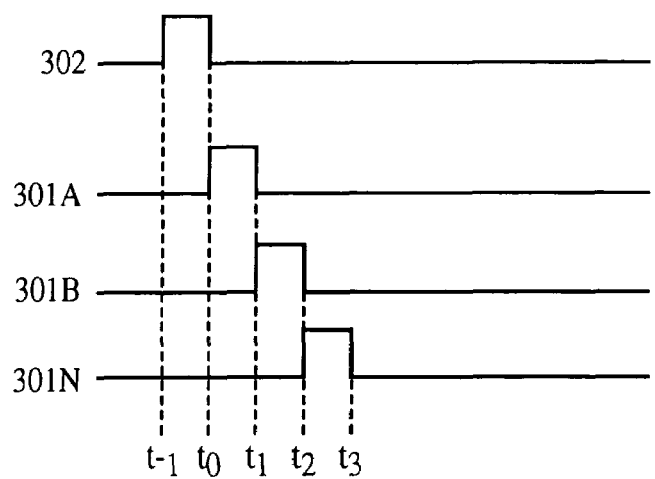
FIG. 16 is a timing diagram.

Assume there are only three stages (A, B, and N), that all delay elements are cleared, and the output of the pulse generator 302 is low, thus all sink elements 100 are off. Referring to FIG. 16, the pulse generator produces a pulse beginning at time t-1 and ending at time t0. After one delay period (preferably equal to the pulse width) at time t0, the output of delay element 301A goes high turning on sink element 110A. After a second delay period at time t1, the output of delay line 301A returns low turning off element 100A. At the same time t1, the output of delay element 301B will go high turning on sink element 100B. After another delay period at time t2, the output of delay element 301B will return low turning off sink element 100B and the output of delay element 301N will go high turning on sink element 100N, and so on. In this way a series of N current pulses (corresponding to the number of stages, N, in the current sink) may be generated to produce a test-current waveform as described in connection with FIG. 4 above. In operation, the scan data chain for programming the current level of each sink element 100 may be loaded first and then the power supply performance may be observed.

The delay elements 301 may be matched with the pulse width of the pulse generator 302 by first determining the propagation delay of the delay elements and then designing the pulse generator to produce a matching pulse width and a period greater than the sum of the delay elements. Variations between the delay elements 301 may be reduced using device dimensions, channel widths or lengths, greater than the minimum allowed by the process. For example, a 0.1 micrometer process tolerance may represent a 10% variation in a 1 micrometer-width device, but only 5% variation in a 4 micrometer-width device. Reductions in variation also may be achieved by increasing the channel length of the devices. However, increased channel lengths may produce increased propagation delays. Using the same layout for all of the delay elements may also reduce variations.

Figure 11:
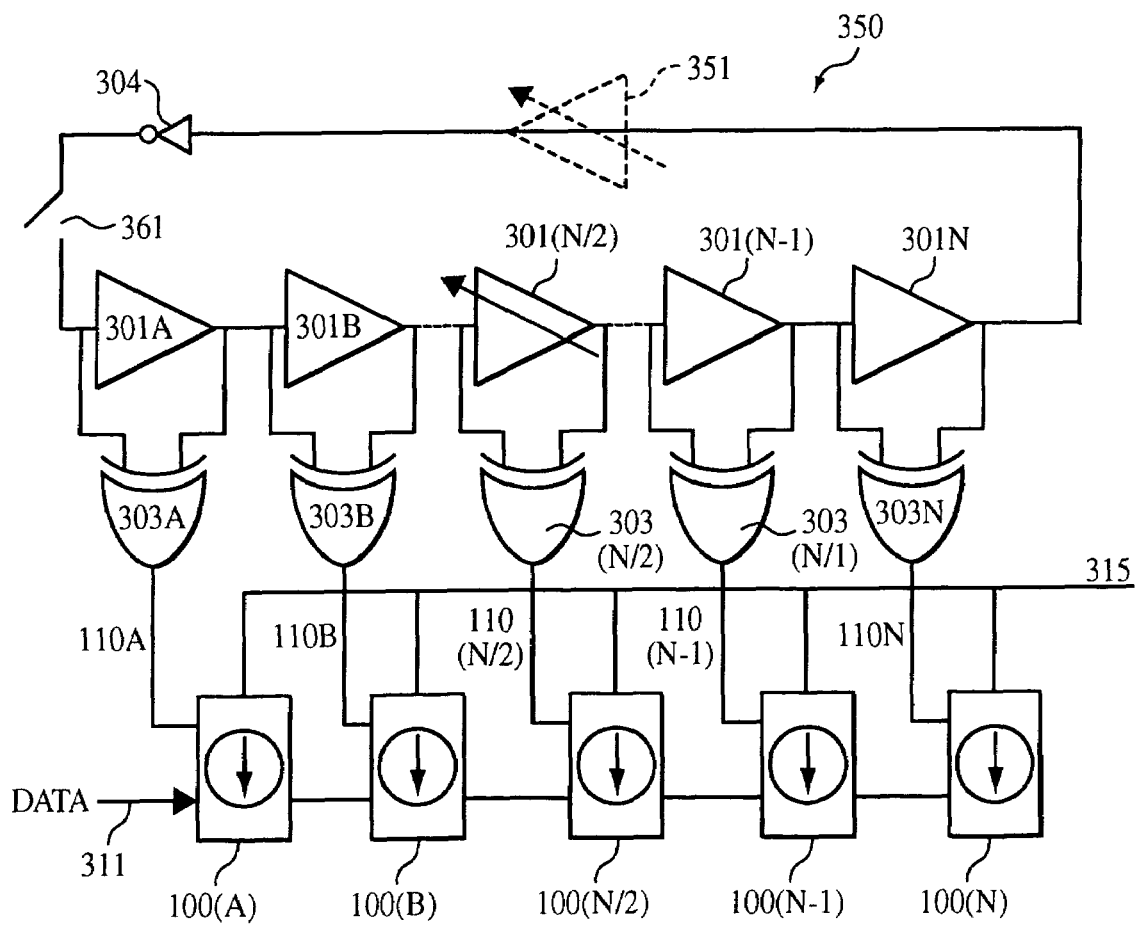
FIG. 11 is a schematic block diagram of a programmable N-stage pulsed current sink with a variable delay for on time control and a disable switch.

Another embodiment of a programmable N-stage pulsed current sink 350, which avoids the need to match the delay time of delay elements 301 to the width of the pulses produced by the pulse generator 302, is shown schematically in FIG. 11. Each of the N stages may include a delay element 301, an exclusive OR ("XOR") gate 303, and a sink element 100. The delay elements 301 may be connected in series to form a delay line. In each stage, the XOR gate 303 inputs may be connected to the input and output of the respective delay element 301 with the XOR gate 303 output driving the enable input 110 of the sink element. Since the XOR gate 303 enables the sink element 100 only when the input and output of its respective delay element do not match, the propagation of the delay element 301 in each stage may be used to determine the duration of the current pulse produced by that stage. For simplicity, all of the stages may use delay elements 301 having the same propagation delay except for the middle stage N/2 that may use a variable delay element 301(N/2) (similar to variable delay 251 in FIGS. 8, 10, 13, and 14). The variable delay 301 (N/2) may be used to extend the on time of the test-current waveform without needlessly increasing the requisite number of stages for the current sink 350. The output of the last delay element 301N may be complemented by inverter 304 and switchably fed back to the input of the first delay element 301A via disable switch 361 (similar to disable switch 261 in FIGS. 10, 13, 14) to create an oscillator (similar to FIGS. 10). Another variable delay 351 (shown in dashed lines) may optionally be added to provide a programmable off time for the test-current waveform.

Assuming that disable switch 361 is open and the inputs and outputs of all delay elements 301A–N (and optional variable delay 351) are low, all XOR gates 303 will disable the sink elements 100 and the output of inverter 304 will be high. When switch 361 is closed, the high signal at the input of delay element 301A causes XOR gate 303A to enable sink element 100A until the high state propagates through delay element 301A. As the first stage is being turned off, the second stage will turn on. The XOR gates may be matched to each other to provide smooth on and off of transitions of adjacent stages. The process continues turning each stage on and then off in succession. After the last stage turns off and after any delay introduced by inverter 304 and the optional variable delay element 351, the process may begin again with switch 361 closed. It should be apparent that the leading edge, trailing edge, on-time, and off-time of the test-current waveform produced by sink 350 may be determined by the stages before N/2, stages after N/2, stage N/2, and delay element 351, respectively. The disable switch 361 may be opened to disable the oscillator.

Referring back to FIG. 15, a plurality (having a number, N) of the programmable current sinks 501, for example the staggered or pulsed type discussed above, may be distributed along the power supply grid for testing. A small number (perhaps 9 or fewer) of current sinks 501 may be used to test small integrated circuits and a larger number (perhaps 36 or more) may be used to test larger integrated circuits such as microprocessors. The sink outputs 215 may be connected to grid 515. The current sinks 501 are shown with their respective scan data inputs 211 and outputs 212 cascaded so that a single serial data stream may be used to program the entire network of current sinks 501. The clock output 213A of sink 501A is shown feeding the synchronization clock inputs 275 of the current sinks 501 via clock line 513 to synchronize the test-current waveforms. Alternatively, the current sinks 501 may be synchronized by cascading the clock outputs 213 and synchronization inputs 275 via connections 514 as shown in broken lines in FIG. 15. Some of the current sinks may be programmed to run independently of the external clock as discussed above in connection with the current sink 280 of FIG. 14 utilizing a multiplexer.

A number of embodiments of the invention have been described. Nevertheless, it will be understood that various modifications may be made without departing from the spirit and scope of the invention. For example, an alternative embodiment of the pulsed current sinks 300, 350 may include an input for selecting an external clock signal to synchronize the sink with an external clock, for example from another current sink. Yet another alternative embodiment of the pulsed current sinks 300, 350 may have programmable delay elements for one or more of the stages. An alternative embodiment of the staggered current sink may allow each sink element to be programmed to switch on and off for programmable durations. It will be appreciated that the power distribution grid and test circuitry may be implemented in silicon or modeled in a computer simulation system for testing. Accordingly, other embodiments are within the scope of the following claims.

What is claimed is:

1. An apparatus comprising:
   a plurality of current sink elements coupled to a sink output common to the plurality of current sink elements to sink current from signals at the common sink output; and
   a delay line to propagate signals to control current sinking by one or more of the current sink elements,
   wherein the delay line includes one or more of a plurality of delay elements having an output to control current sinking by a corresponding current sink element, and
   wherein one or more of the current sink elements are to sink current from signals at the common sink output without sinking current from any signals propagated by the delay line.

2. The apparatus of claim 1, comprising a programmable variable delay element through which signals are to be propagated.

3. The apparatus of claim 1, wherein the delay line comprises delay elements to turn current sink elements on and off in succession.

4. The apparatus of claim 1, wherein an output for the delay line is coupled to an input for the delay line to enable oscillation.

5. The apparatus of claim 4, comprising a switch to disable oscillation.

6. The apparatus of claim 4, comprising a variable delay element through which signals are to be propagated.

7. The apparatus of claim 6, wherein the variable delay element is to control an on time or off time for sinking current.

8. The apparatus of claim 6, wherein the variable delay element is to control oscillation frequency.

9. The apparatus of claim 1, comprising switches coupled to select one or more delay elements to form the delay line.

10. The apparatus of claim 1, comprising switches coupled to select a feedback path for the delay line.

11. The apparatus of claim 1, comprising a multiplexer having inputs coupled to outputs of delay elements and having an output coupled to an input for the delay line.

12. The apparatus of claim 1, wherein at least one current sink element includes:
    a plurality of transistors, and
    a shift register having outputs to control corresponding transistors.

13. The apparatus of claim 1, wherein at least one current sink element is programmable.

14. The apparatus of claim 1, comprising a power distribution grid coupled to the sink output.

15. The apparatus of claim 14, wherein signals at the common sink output are for a current test waveform to test the power distribution grid.

16. The apparatus of claim 1, comprising a gate having inputs coupled to switches to select an output for a delay element as an output for the delay line.

17. The apparatus of claim 1, comprising a pulse generator coupled to an input for the delay line.

18. The apparatus of claim 17, wherein the pulse generator is to produce pulses having a duration corresponding to a propagation delay of delay elements of the delay line.

19. The apparatus of claim 1, comprising:
    a plurality of gates having inputs coupled across corresponding delay elements of the delay line and having an output coupled to control a corresponding current sink element.

20. The apparatus of claim 19, wherein the delay line includes a variable delay element.

21. A method comprising:
    propagating signals over a delay line including one or more of a plurality of delay elements; and
    controlling, by an output for one or more of the delay elements, current sinking by one or more of a plurality of current sink elements coupled to a sink output common to the plurality of current sink elements to sink current from signals at the common sink output without sinking current from any signals propagated over the delay line.

22. The method of claim 21, comprising programming one or more current sink elements.

23. The method of claim 21, comprising programming a variable delay element through which signals are to be propagated.

24. The method of claim 21, comprising:
    selecting one or more delay elements to form the delay line.

25. The method of claim 21, comprising:
    selecting a feedback path for the delay line.

26. The method of claim 21, wherein an output for the delay line is coupled to an input for the delay line to enable oscillation of signals, and wherein the method comprises controlling oscillation of signals.

27. The method of claim 21, comprising:
    testing a power distribution grid using signals at the common sink output.

28. The method of claim 21, comprising:
    testing a noise suppression technique using signals at the common sink output.

29. The method of claim 21, comprising:
    generating pulses on the delay line.

* * * * *